United States Patent [19]

Kondoh

[11] Patent Number: 4,990,978
[45] Date of Patent: Feb. 5, 1991

[54] SEMICONDUCTOR DEVICE

[75] Inventor: Hisao Kondoh, Itami, Japan

[73] Assignee: Mitsubishi Denki Kabushiki Kaisha, Tokyo, Japan

[21] Appl. No.: 296,861

[22] Filed: Jan. 13, 1989

Related U.S. Application Data

[63] Continuation of Ser. No. 89,516, Aug. 26, 1987, abandoned.

[30] Foreign Application Priority Data

Jun. 8, 1987 [JP] Japan .................. 62-142713

[51] Int. Cl.$^5$ ........................... H01L 29/78
[52] U.S. Cl. ..................... 357/23.4; 357/43; 357/38
[58] Field of Search ............ 357/23.4, 43, 46, 38

[56] References Cited

U.S. PATENT DOCUMENTS

| 4,672,407 | 6/1987 | Nakagawa | 357/23.4 |
| 4,672,584 | 6/1987 | Tsuji | 357/43 |
| 4,760,431 | 7/1988 | Nakagawa | 357/23.4 |

FOREIGN PATENT DOCUMENTS

| 61-222260 | 10/1986 | Japan | 357/23.4 |
| 2584237 | 1/1987 | Japan | 357/43 |

OTHER PUBLICATIONS

IBM Technical Disclosure Bulletin, vol. 22 #12, pp. 5291-5293 by Garnache, May 1980.
"An Analytical Model for the Power Bipolar-MOS Transistor", Solid State Electronics, vol. 29, No. 12, 1986, pp. 1229-1237.
"Optimization of Epitaxial Layers for Power Bipolar--MOS Transistor", IEEE Electron Device Letters, vol. ELD-7, No. 9, 1986, pp. 510-512.
"MOSFET Measures Current with No Loss", Electronic Design, Feb. 20, 1986.
"Lossless Current Sensing with Sensefets Enhances Motor Drive Design", PCIM, Apr. 1986, pp. 30-34.

Primary Examiner—Andrew J. James
Assistant Examiner—Mark Prenty
Attorney, Agent, or Firm—Oblon, Spivak, McClelland, Maier & Neustadt

[57] ABSTRACT

A semiconductor substrate is provided thereon with an insulated gate bipolar transistor which is a composite element of a pnpn thyristor and an N-channel MOSFET. In order to monitor operating current of the insulated gate bipolar transistor, a monitor terminal is provided in addition to collector, emitter and gate terminals. The operating current of the insulated gate bipolar transistor is monitored through the monitor terminal to perform appropriate protective operation when the operating current reaches a critical region, thereby to prevent occurrence of a latch-up phenomenon.

5 Claims, 8 Drawing Sheets

4,990,978

SEMICONDUCTOR DEVICE

This application is a Continuation of application Ser. No. 089,516, filed on Aug. 26, 1987, now abandoned.

BACKGROUND OF THE INVENTION

1. Field of the Invention

The present invention relates to a semiconductor device, and more particularly, it relates to an improvement in an insulated gate bipolar transistor (hereinafter referred to as IGBT), for preventing a latch-up phenomenon.

2. Description of the Prior Art

FIG. 1 is a sectional view schematically showing the structure of a conventional IGBT device. In general, an IGBT device 1 is formed by a number of IGBT elements 2 connected in parallel with each other. FIG. 2 shows an equivalent circuit of a single IGBT element 2, and FIG. 3 shows an equivalent circuit of the entire IGBT device 1.

Referring to FIG. 1, an $N^-$-type layer 4 is epitaxially grown on one major surface of a $P^+$-type semiconductor substrate 3. Impurities are selectively diffused from the surface of the $N^-$-type layer 4 to form a plurality of P-type regions 5, while impurities are selectively diffused from the surface of each P-type region 5 to form a pair of $N^+$-type regions 6. An insulation film 7 is formed on the surfaces of the P-type regions 5 between the surface of the $N^-$-type layer 4 and those of the $N^+$-type regions 6. The insulation film 7 also covers the surface of the $N^-$-type layer 4 to be integral between each adjacent pair of IGBT elements 2. A gate electrode 8 of, e.g., polysilicon, is formed on the insulation film 7, while emitter electrodes 9 of metal such as aluminum are formed to be electrically connected to both of the P-type regions 5 and $N^+$-type regions 6. Each emitter electrode 9 is commonly provided between each adjacent pair of IGBT elements 2 in the same P-type region 5. The gate electrode 8 and the emitter electrodes 9 are in multilayer structure through insulation films (not shown), to be commonly electrically connected to a number of IGBT elements 2. On the rear surface of the $P^+$-type semiconductor substrate 3, a metal collector electrode 10 is integrally provided for all of the IGBT elements 2. The gate electrode 8 is connected to a gate terminal G of the IGBT device 1 and each emitter electrode 9 is connected to an emitter terminal E, while the collector electrode 10 is connected to a collector terminal C through wire bonding and die bonding respectively.

Thus, each IGBT element 2 forms an N-channel double diffusion vertical MOS-FET on the $P^+$-type semiconductor substrate 3, which may be regarded as a composite element of a pnpn thyristor and an N-channel MOS-FET, as obvious from the equivalent circuit shown in FIG. 2. When positive voltage is applied to the collector terminal C and the emitter terminal E is grounded while appropriate control voltage is applied to the gate terminal G in normal operation, holes are injected in a drain formed by the $N^-$-type layer 4, thereby to achive low on-resistance. No current flows in the gate electrode 8 since the same is isolated from an active region of the transistor. In other words, the IGBT device 1 has both characteristics of low on-resistance of a bipolar transistor and high input impedance of a MOS-FET. Thus, the IGBT device 1 can be formed by several thousands of parallelly connected IGBT elements 2, for example, thereby to implement a power transistor of high performance which can supply current of about 50 A.

When small current flows in the IGBT element 2, potential difference across a diffusion resistor $R_S$ of the P-type region 5 is small and a shorted state is maintained between the base and the emitter of an npn transistor 11. The npn transistor 11 is not driven in this state, and the IGBT element 2 operates as a composite element of an N-channel MOS-FET 12 and a pnp transistor 13. The base current of the pnp transistor 13 is controlled by the N-channel MOS-FET 12 in in this case, whereby main current $i_c$ for the IGBT element 2 can be controlled by a control signal applied to the gate terminal G.

As obvious from the equivalent circuit of FIG. 2, the main current $i_c$ for the IGBT element 2 is the sum of electron current $i_e$ flowing in the MOS-FET 12 and collector current (hole current) $i_h$ of the pnp transistor 13. Assuming that symbol $i_E$ represents current flowing in the emitter terminal E, the following relation holds:

$$i_C = i_E = i_e + i_h \qquad (1)$$

With reference to FIG. 1, a channel is formed in the P-type region 5 by the control signal applied to the gate electrode 8, whereby electrons are injected in the drain, i.e., the $N^-$-type region 4 while holes are injected in the base of the pnp transitor 13, i.e., the $N^-$-type region 4 from the collector, i.e., the $P^+$-type region 3, so that the injected holes are partially recombined with the electrons to be extinguished while the remaining holes flow in the P-type region 5 as the collector current $i_h$.

The conventional IGBT device 1 is in the aforementioned structure, and when the main current $i_c$ for the IGBT element 2 is increased by some external cause such as noise applied to the gate terminal G, the electron current $i_e$ and the hole current $i_h$ are increased. If the hole curent $i_h$ exceeds a prescribed level at this time, the voltage drop across the resistor $R_S$ exceeds a threshold value for conduction of the npn transistor 11. In other words, the base-emitter junction of the npn transistor 11 is forward-biased to exceed the diffusion potential, whereby the pnpn thyristor formed by the npn transistor 11 and the pnp transistor 13 enters a conducting state. In this state, the main current $i_c$ for the IGBT element 2 cannot be controlled by the control signal applied to the gate terminal G. This is the so-called latch-up phenomenon. The P-type region 5 may be formed so that the resistance $R_S$ is reduced to the minimum in order to prevent the latch-up phenomenon, whereas such reduction is restricted. Therefore, when the latch-up phenomenon takes place, excess main current $i_c$ incontrollably flows to break the IGBT device 1 as well as to damage peripheral devices connected to the same.

SUMMARY OF THE INVENTION

A semiconductor device according to the present invention comprises a semiconductor substrate, an insulated gate bipolar transistor formed on the semiconductor substrate and a monitor terminal for monitoring operating current of the insulated gate bipolar transistor. The operating current of an IGBT element can be monitored through the monitor terminal, so that occurrence of a latch-up phenomenon can be prevented by performing proper protective operation when the operating current reaches a critical region.

Accordingly, the principal object of the present invention is to provide a semiconductor device, which can effectively prevent occurrence of a latch-up phenomenon.

These and other objects, features, aspects and advantages of the present invention will become more apparent form the following detailed description of the present invention when taken in conjunction with the accompanying drawings.

DESCRIPTION OF THE PREFERRED EMBODIMENTS

Figure 4:
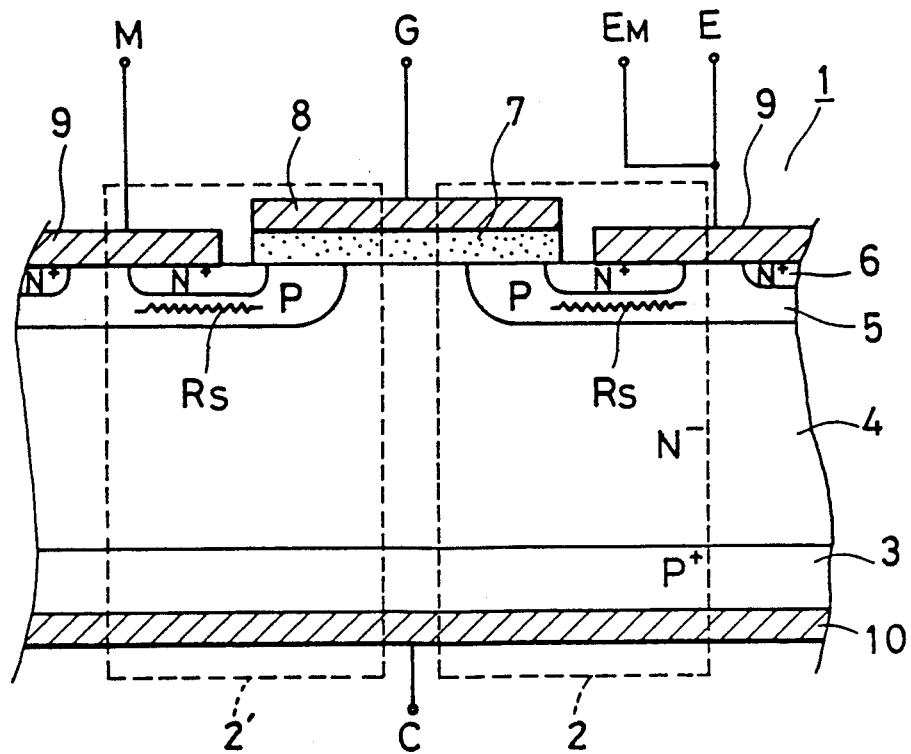
FIG. 4 is a sectional view showing the structure of an embodiment of the present invention.
Figure 5:
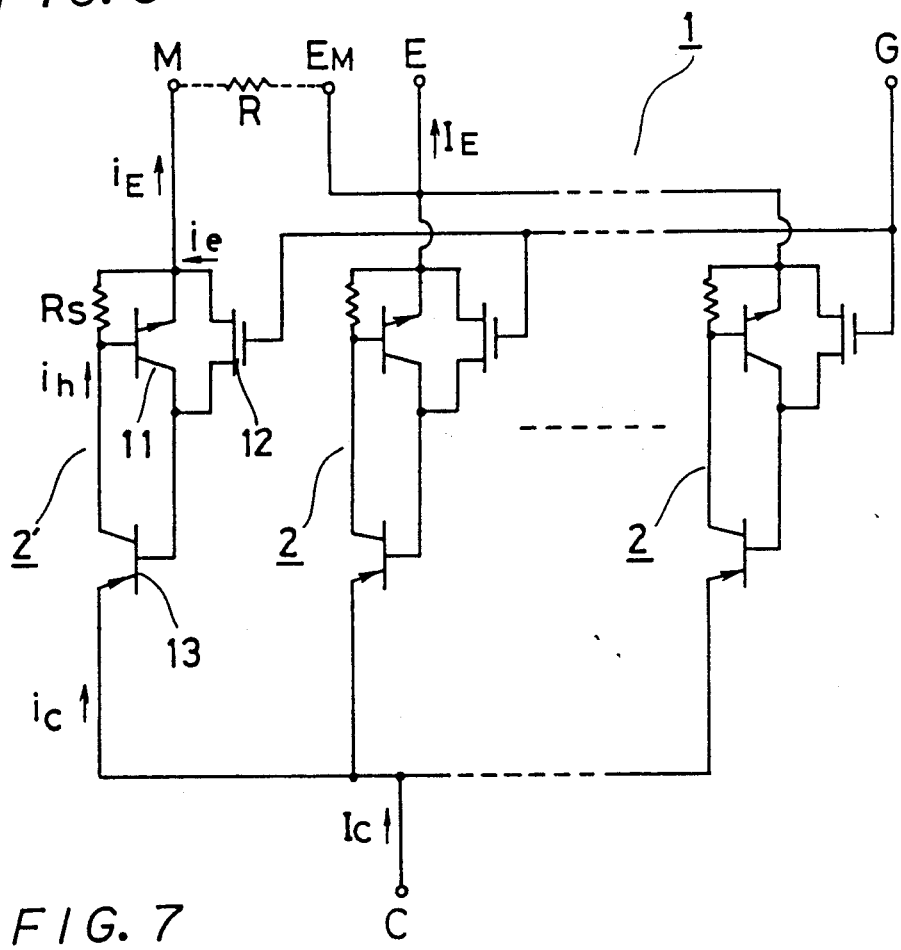
FIG. 5 is a circuit diagram showing an equivalent circuit thereof.

FIG. 4 is a sectional view schematically showing the structure of an IGBT device according to an embodiment of the present invention and FIG. 5 is a circuit diagram showing an equivalent circuit thereof.

Figure 1:
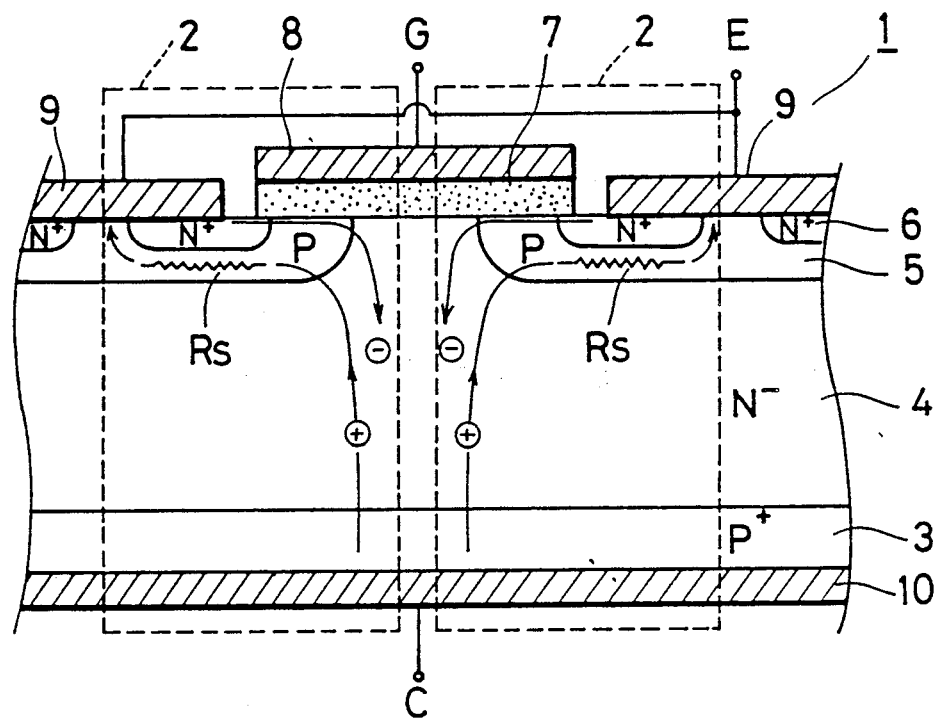
FIG. 1 is a sectional view showing the structure of a conventional IGBT apparatus.
Figure 3:
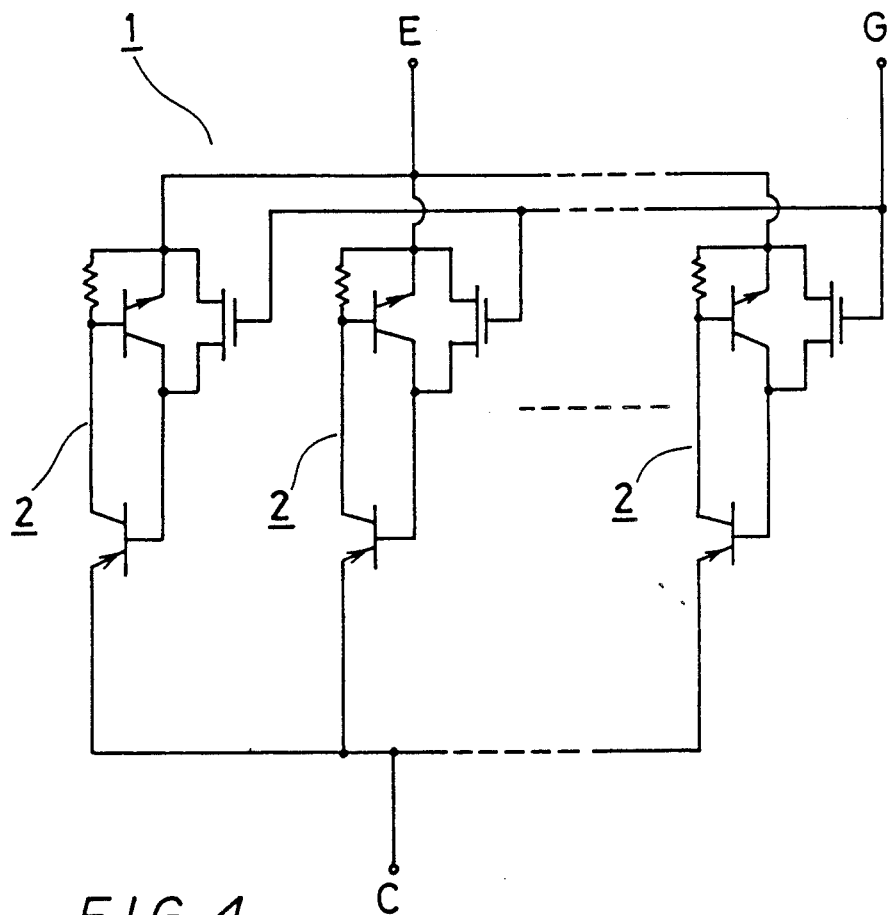
FIG. 3 is a circuit diagram showing an equivalent circuit of the conventional IGBT device.

An IGBT device 1 according to the embodiment is different from the conventional IGBT device 1 shown in FIG. 1 and 3 in the following points: An emitter electrode 9 of an IGBT element 2' within a number of parallely connected IGBT elements 2 is connected to a newly provided monitor terminal M through wire bonding, while a bonding wire for connecting each of remaining emitter electrodes 9 to an emitter terminal E is extended from the emitter terminal E to a newly provided emitter monitor terminal $E_M$ so that the remaining emitter electrode 9 is connected to both of the emitter terminal E and the emitter monitor terminal $E_M$. Other structure of the embodiment is identical to that of the conventional IGBT device shown in FIGS. 1 and 3.

In the IGBT device 1 of the embodiment, an external resistor R is connected between the terminals M and $E_M$ as shown in FIG. 5, so that main current $I_C$ for the IGBT device 1 can be monitored through potential difference appearing across the external resistor R. Current $i_E$ flowing in the external resistor R is obtained by dividing emitter current $I_E$ of the IGBT device 1, and the following relation holds:

$$I_C = I_E \quad (2)$$

whereby the value of the main current $I_C$ can be recognized by monitoring the current $i_E$. The ratio of $i_E$ to $I_E$ is determined by the number of IGBT elements 2' connected to the monitor terminal M. When it is detected that the main current $I_C$ reaches a critical region for a latch-up phenomenon through monitoring of the current $i_E$, a protective circuit (not shown) can be driven by a monitor signal, for example, to cut off a control signal to a gate terminal G, thereby to prevent occurrence of the latch-up phenomenon.

Figure 2:
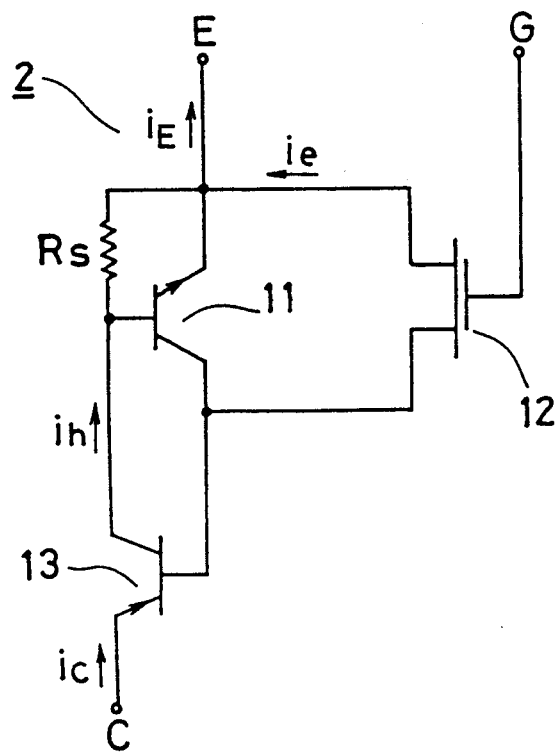
FIG. 2 is a circuit diagram showing an equivalent circuit of an IGBT element.
Figure 6:
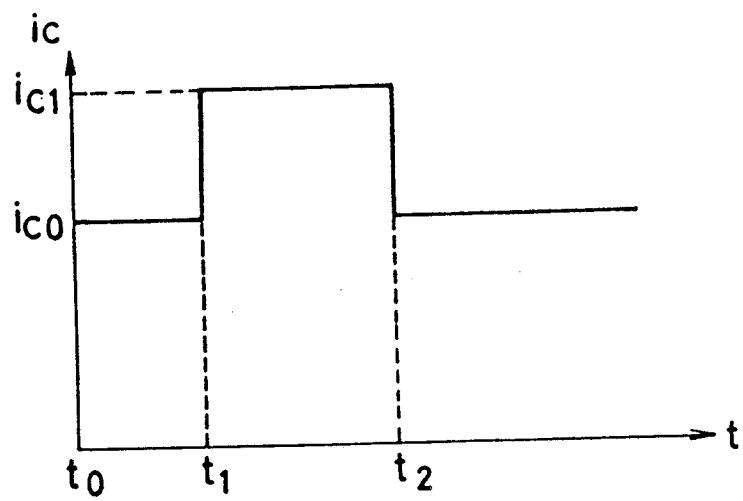
FIG. 6A-6C are illustrates time change of current flowing in each part in operation of the embodiment.
Figure 6:
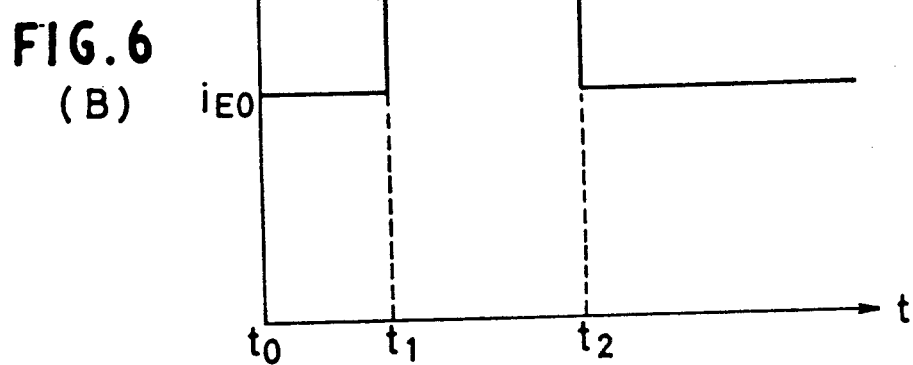
Figure 6:
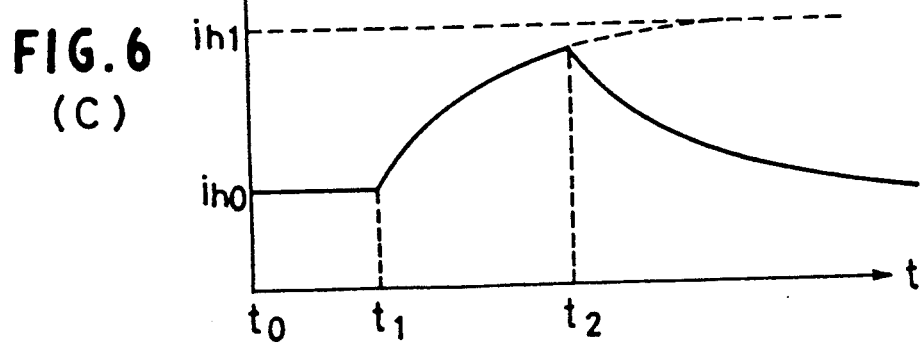

With reference to the IGBT element 2' of FIG. 5, it is assumed that symbol $i_C$ represents the main current, symbol $i_h$ represents hole current flowing in the collector of a pnp transistor 13 and symbol $i_e$ represents electron current flowing in an N-channel MOS-FET 12 similarly to the case of FIG. 2. Referring to FIG. 6, it is assumed that stationary main current $i_C$ (represented by $i_{C0}$ at (A) of FIG. 6) flows in the IGBT element 2' in a normal operating state between times $t_0$ and $t_1$. Since the IGBT element 2' is not latched up in this state, the main current $i_C$ can be controlled by the control signal supplied to the gate terminal G. In this case, the hole current $i_h$ (represented by $i_{h0}$ at (C) of FIG. 6) flowing in a resistor $R_S$ is approximately provided by the following expression:

$$i_{h0} = \alpha_N i_{C0} \quad (3)$$

where $\alpha_N$ represents the common base current gain of the pnp transistor 13. Assuming that symbol $i_{E0}$ represents the emitter current $i_E$ in this state as shown at FIG. 6(B), the following expression holds with the condition of continuity of current:

$$i_{E0} = i_{C0} \quad (4)$$

Thus, the hole current $i_{h0}$ and the emitter current $i_{E0}$ are in proportional relation as obvious from the expressions (3) and (4), whereby the hole current $i_h$ can be correctly monitored by monitoring the emitter current $i_E$ in a stationary state to correctly predict occurrence of the latch-up phenomenon, which is caused by increase in the voltage drop across the resistor $R_S$ as the result of increase in the hole current $i_h$.

When the operation of the IGBT device 1 is in a transient state, however, it is difficult to correctly monitor the hole current $i_h$ by the aforementioned first embodiment. It is assumed here that the main current $I_C$ of the IGBT device 1 is stepwisely increased by some external cause and the main current $i_C$ of the IGBT element 2' is followingly stepwisely increased from $i_{C0}$ to $i_{C1}$ ($i_{C1} > i_{C0}$), to be again stepwisely reduced to $i_{C0}$. FIGS. 6(A), (B) and (C) show changes of the main current $i_C$, the emitter current $i_E$ and the hole current $i_h$ of the IGBT element 2' in this state between the times $t_1$ and $t_2$.

When the main current $i_C$ is stepwisely increased, the emitter current $i_E$ is also stepwisely increased while the hole current $i_h$ is loosely increased. This is because holes caused by the increase in the main current $i_C$ are injected in an N$^-$-type layer 4, which serves as the base region of the pnp transistor 13, and diffused to flow in the resistor $R_S$ as the hole current $i_h$. The increase curve at FIG. 6(C) is approximately expressed as follows:

$$\begin{aligned} i_h &= i_{h0} + (i_{h1} - i_{h0})(1 - e^{-\omega_N(t-t_1)}) \\ &= \alpha_N i_{C0} + \alpha_N(i_{C1} - i_{C0}) \cdot (1 - e^{-\omega_N(t-t_1)}) \end{aligned} \quad (5)$$

-continued (where $t_2 > t > t_1$)

the decrease curve at FIG. 6(C) is approximately expressed as follows:

$$i_h = \alpha_N i_{C0} + \alpha_N(i_{C1} - i_{C0}) \cdot (1 - e^{-\omega_N(t-t_1)}) \quad (6)$$
$$- \alpha_N(i_{C1} - i_{C0}) \cdot (1 - e^{-\omega_N(t-t_2)})$$

(where $t \geqq t_2$).

Where symbol $\omega_N$ represents alpha cutoff angular frequency of the pnp transistor 13.

Referring to FIG. 6, when pulse width $(t_2-t_1)$ is so large that the relation of $\omega_N (t_2-t_1) >> 1$ holds, the maximum value $i_{hp}$ of the increase curve at FIG. 6(C) is obtained from the expression (5), as follows:

$$i_{hp} = \alpha_N i_{C0} + \alpha_N (i_{C1} - i_{C0}) \quad (7)$$
$$= \alpha_N i_{C1}$$

Thus, when the pulse width $(t_2-t_1)$ is large, the hole current $i_h$ is proportionate to the main current $i_C$ and the emitter current $i_E$, whereby the hole current $i_h$ can be monitored by measuring the emitter current $i_E$.

When the pulse width $(t_2-t_1)$ is short, on the other hand, the maximum value $i_{hp}$ of the hole current $i_h$ is obtained from the expression (5), as follows:

$$i_{hp} = \alpha_N i_{C0} + \alpha_N (i_{C1} - i_{C0}) \cdot (1 - e^{-\omega_N(t_2-t_1)}) \quad (8)$$
$$= \alpha_N i_{C1} - \alpha_N (i_{C1} - i_{C0})(e^{-\omega_N(t_2-t_1)})$$

Thus, when the pulse width $(t_2-t_1)$ is short, the maximum value $i_{hp}$ of the hole current $i_h$ is the function of the pulse width, which is not necessarily proportionate to the main current $i_C$. Thus, the hole current $i_h$ is not necessarily correctly monitored in the IGBT device 1 of the aforementioned first embodiment, and a malfunction may result when the device is interlocked with a protective circuit, for example. In other words, the emitter current $i_E$ may reach a critical region although the hole current $i_h$ causing a latch-up phenomenon is not in a critical region, to erroneously perform protective operation.

Figure 7:
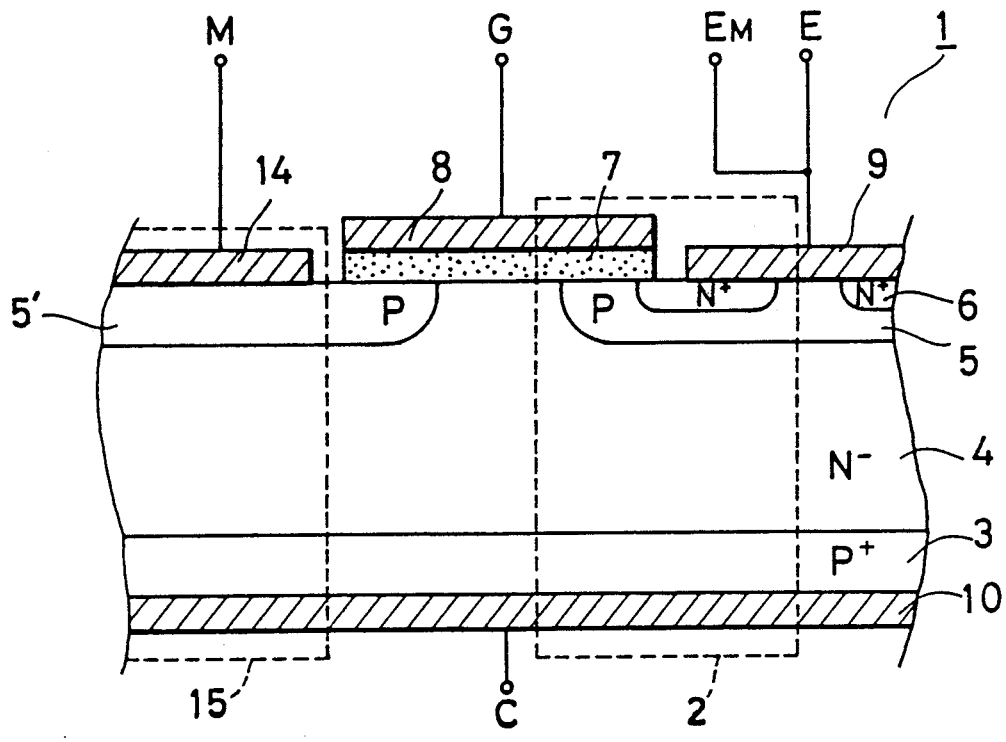
FIG. 7 is a sectional view showing the structure of a second embodiment of the present invention.
Figure 8:
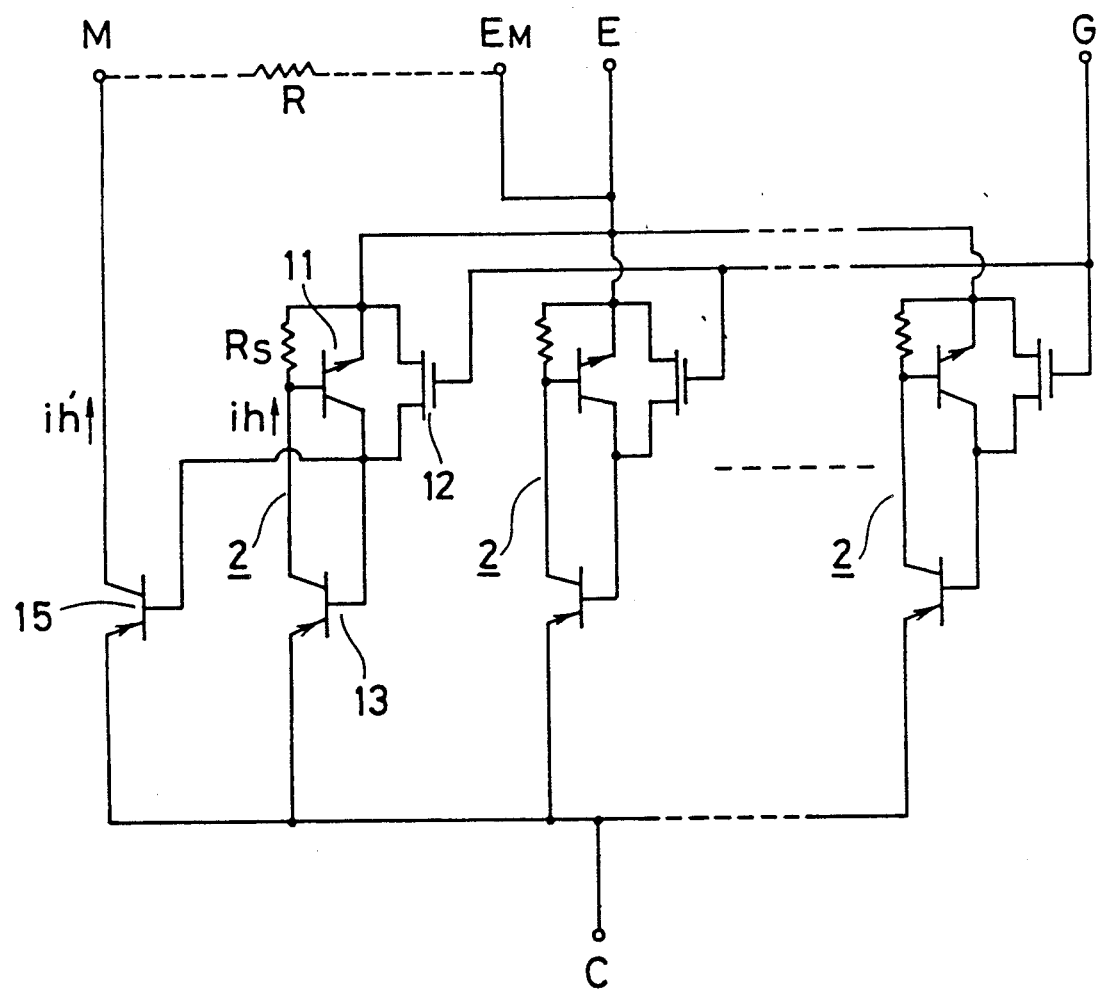
FIG. 8 is a circuit diagram showing an equivalent circuit thereof.

FIG. 7 is a sectional view schematically showing the structure of an IGBT device according to a second embodiment of a semiconductor device according to the present invention which is adapted to solve such problem, and FIG. 8 is a circuit diagram showing an equivalent circuit of this device. In an IGBT device 1 of the second embodiment, no N+-type region is provided in a P-type region 5' within a plurality of P-type regions 5 formed in the surface of an N−-type layer 4. A detecting electrode 14 of, e.g., aluminum is formed to be electrically connected to the P-type region 5', which detecting electrode 14 is connected to a monitor terminal M, thereby to form a pnp transistor 15 between a collector terminal C and the monitor terminal M.

The base current for the pnp transistor 15 is supplied through a MOS transistor 12, whereby the pnp transistor 15 operates similarly to pnp transistors 13 of respective IGBT elements 2, and hole current $i_h'$ corresponding to hole current $i_h$ flowing in the collector of the pnp transistor 13 of each IGBT element 2 flows in the collector of the pnp transistor 15. Thus, an external resistor R is connected between the terminals M and $E_M$ as shown in FIG. 8, so that the hole current $i_h$ of the IGBT element 2 itself can be correctly monitored through potential difference appearing across the external resistor R.

When overcurrent of short pulse width flows as hereinabove described, the hole current $i_h$ causing a latch-up phenomenon cannot be correctly monitored in the IGBT device according to the first embodiment shown in FIGS. 4 and 5. In the second embodiment of the present invention, on the other hand, the hole current $i_h$ itself is monitored, whereby the same can be correctly monitored with no regard to the pulse width of the overcurrent, to enable correct operation of a protective circuit by a monitor signal.

Figure 9:
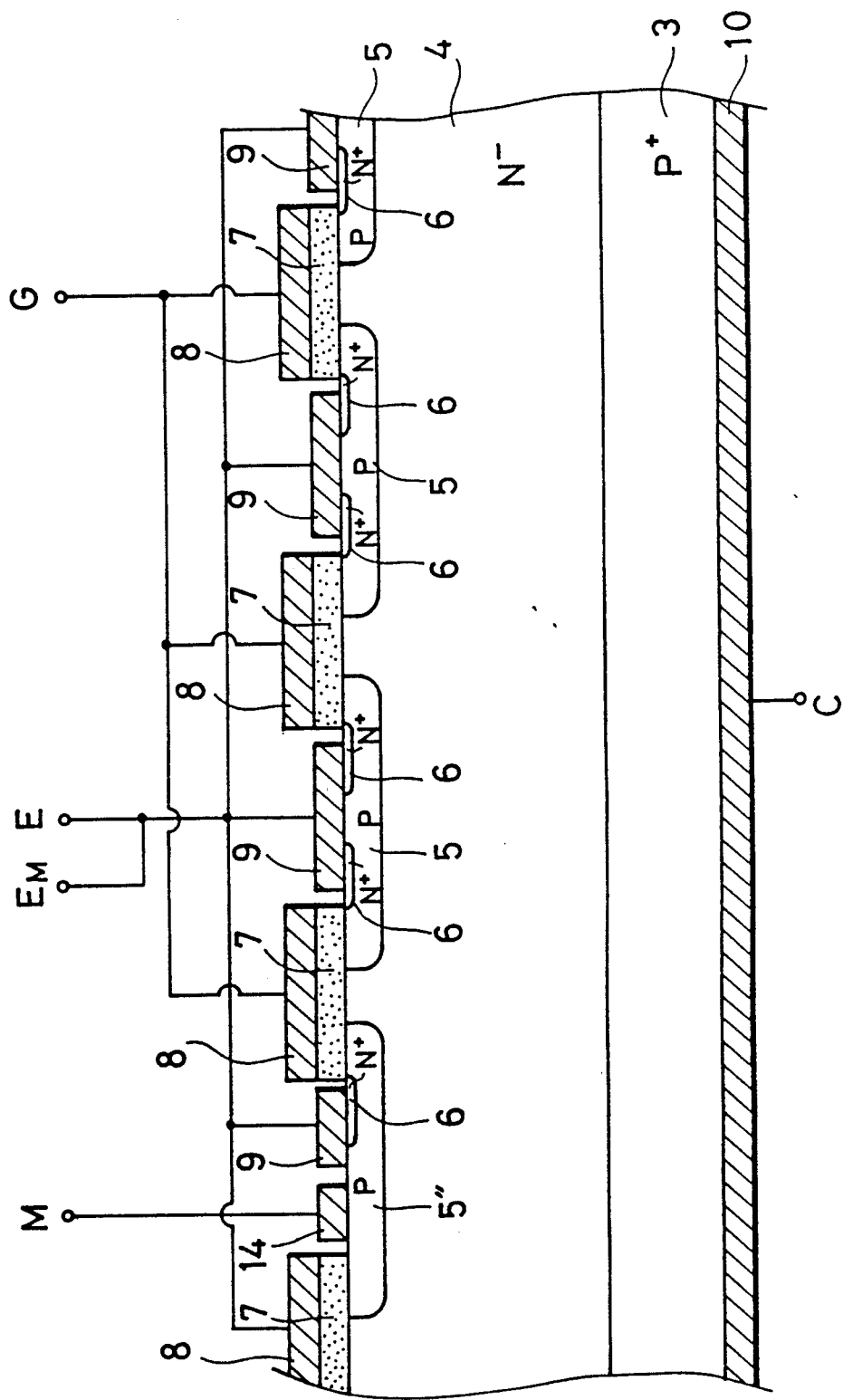
FIG. 9 is a sectional view showing a modification of the second embodiment.

FIG. 9 is a sectional view schematically showing the structure of an IGBT device according to a modification of the second embodiment shown in FIGS. 7 and 8. In this modification, an emitter electrode 9 and a detecting electrode 14 are provided in the same P-type region 5", while the other structure is identical to that of the second embodiment. This modification attains a similar effect to the second embodiment. Although the detecting electrode 14 is provided in a single P-type region 5' or 5" in FIG. 7 or 9, such detecting electrodes 14 may be provided in a plurality of P-type regions, as a matter of course. Further, although an insulation film 7 and a gate electrode 8 are arranged also on the P-type region 5' provided with the detecting electrode 14 in FIG. 7, such structure is directed to simplify manufacturing of the device by making the insulation film 7 and the gate electrode 8 identical in configuration to other insulation films and gate electrodes, and the same are not necessarily present on the P-type region 5' in operation.

Figure 10:
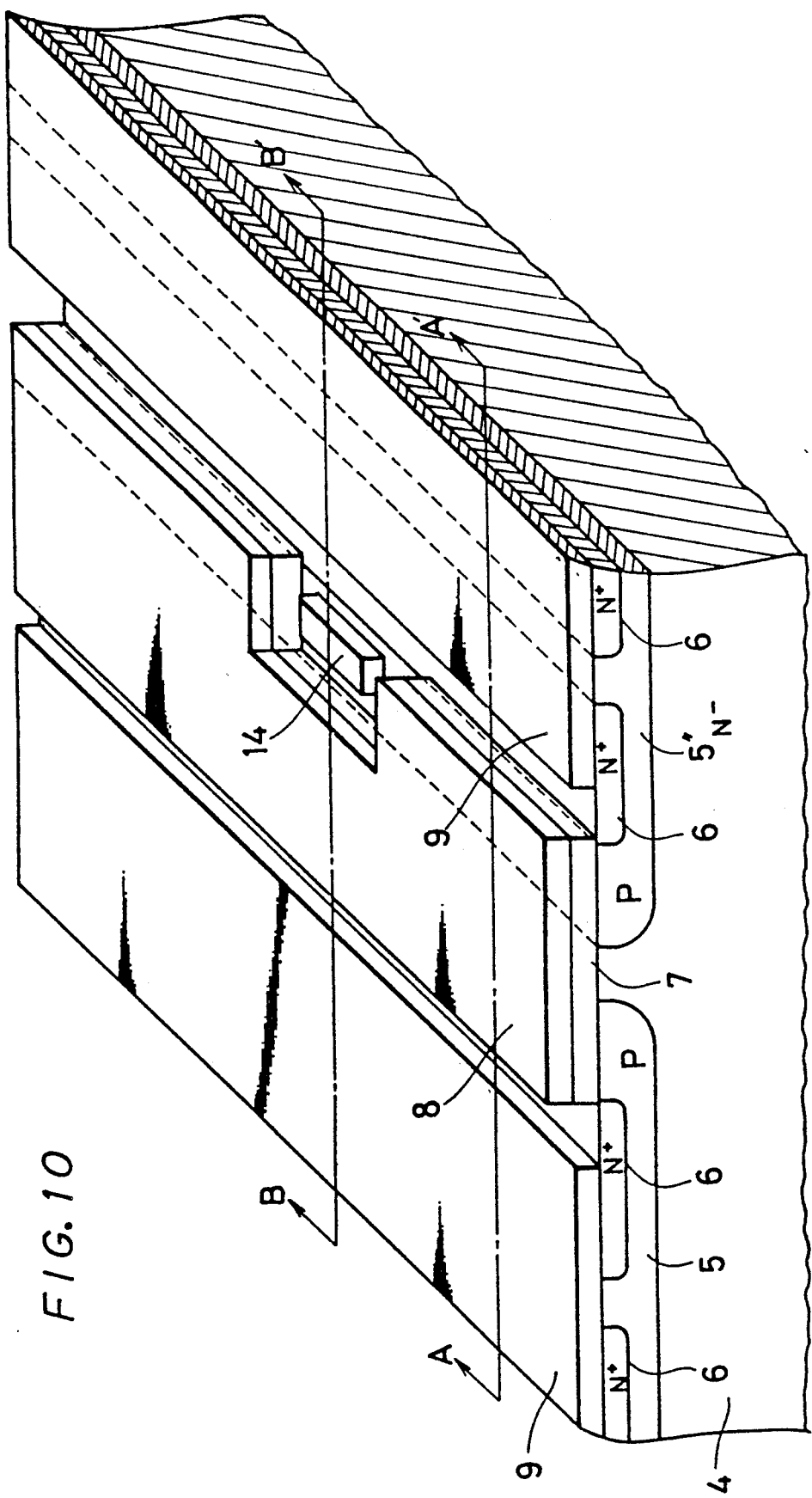
FIG. 10 is a partially fragmented perspective view showing another modification of the second embodiment.
Figure 11:
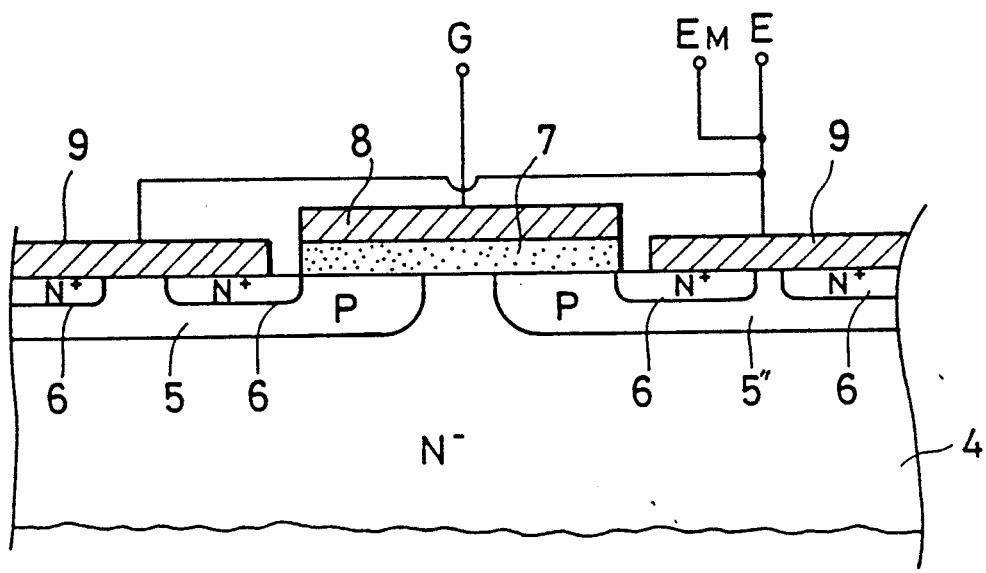
FIGS. 11 and 12 are sectional views taken along the lines A—A' and B—B' in FIG. 10 respectively.
Figure 12:
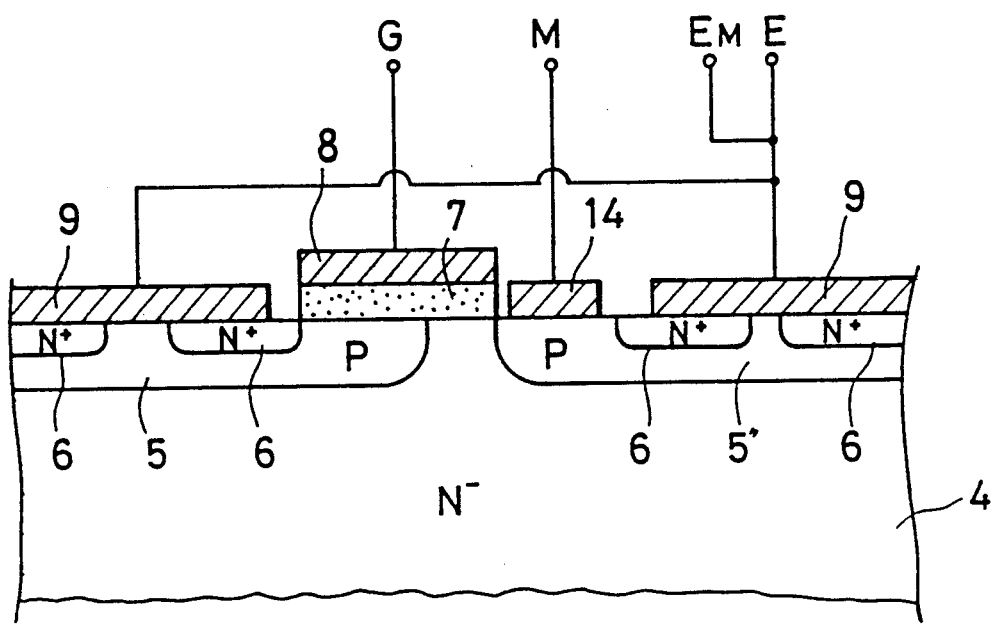

FIG. 10 is a partially fragmented perspective view showing the structure of an IGBT device according to another modification of the second embodiment, and FIGS. 11 and 12 are sectional views taken along the lines A–A' and B–B' in FIG. 10. In this modification, an emitter electrode 9 and a detecting electrode 14 are provided in the same P-type region 5" similarly to the modification shown in FIG. 9, while an insulation film 7 and a gate electrode 8 are partially recessed to provide the detecting electrode 14 on the surface of the P-type region 5" between the surfaces of an N−-type layer 4 and an N+-type region 6, i.e., in a part of a region for forming the channel of a MOS transistor 12. According to such structure, hole current $i_h$ can be monitored by connecting an external resistor between terminals M and $E_M$ while forward bias voltage itself, applied to the base-emitter junction of an npn transistor 11, can be monitored by connecting a voltmeter having larger input impedance between the terminals M and $E_M$, whereby occurrence of a latch-up phenomenon can be most directly predicted depending on whether or not the voltage level approaches a threshold value for conduction of the npn transistor 11.

Although the emitter monitor terminal $E_M$ is provided in each of the aforementioned embodiments, the function thereof may be taken over by the emitter terminal E. Further, although the IGBT device is formed by a number of parallely connected IGBT elements, each of the second embodiment and the modification thereof can be applied to a single IGBT element.

According to the present invention as hereinabove described, a monitor terminal is provided to monitor operating current of each IGBT element so that occurrence of a latch-up phenomenon can be prevented by performing appropriate protective operation when the operating current reaches a critical region, whereby no damage by overcurrent is caused in the IGBT device itself and peripheral devices connected to the same.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a first conductivity type semiconductor substrate having first and second major surfaces;
   a second conductivity type semiconductor layer formed on said first major surface of said semiconductor substrate;
   a first conductivity type first region formed in a surface of said semiconductor layer;
   a first conductivity type second region formed in the surface of said semiconductor layer;
   a second conductivity type third region formed in each surface of said first and second regions;
   a first electrode formed on said second major surface of said semiconductor substrate;
   a second electrode formed on adjacent surfaces of said first and third regions,
   an insulation film formed on said each surface of said first and second regions between the surfaces of said semiconductor layer and said third region;
   a control electrode formed on said insulation film for controlling main current on the semiconductor device flowing between said first and second electrodes;
   a third electrode formed on adjacent surfaces of said second and third regions; and, means for monitoring current flowing through said third electrode in order to monitor said main current.

2. A semiconductor device comprising:
   a first conductivity type semiconductor substrate having first and second major surfaces;
   a second conductivity type semiconductor layer formed on said first major surface of said semiconductor substrate;
   a first conductivity type first region formed in a surface of said semiconductor layer;
   a first conductivity type second region formed in the surface of said semiconductor layer;
   a second conductivity type third region formed in a surface of said first region;
   a first electrode formed on said second major surface of said semiconductor substrate;
   a second electrode formed on adjacent surfaces of said first and third regions,
   an insulation film formed on the surface of said first region between the surfaces of said semiconductor layer and said third region;
   a control electrode formed on said insulation film for controlling main current of the semiconductor device flowing between said first and second electrodes;
   a third electrode formed on a surface of said second region; and, means for monitoring current flowing through said third electrode in order to monitor a component of said main current, which flows between said first and second electrodes through said semiconductor substrate, said semiconductor layer and said first region.

3. A semiconductor device comprising:
   a first conductivity type semiconductor substrate having first and second major surfaces;
   a second conductivity type semiconductor layer formed on said first major surface of said semiconductor substrate;
   a first conductivity type first region formed in a surface of said semiconductor layer;
   a second conductivity type second region formed in a surface of said first region;
   a first electrode formed on said second major surface of said semiconductor substrate;
   a second electrode formed on adjacent surfaces of said first and second regions,
   an insulation film formed on the surface of said first region between the surfaces of said semiconductor layer and said second region;
   a control electrode formed on said insulation film for controlling a main current of the semiconductor device flowing between said first and second electrodes;
   a third electrode formed on the surface of said first region; and, means for monitoring current flowing through said third electrode in order to monitor a component of said main current, which flows between said first and second electrodes through said semiconductor substrate, said semiconductor layer and said first region.

4. A semiconductor device in accordance with claim 3, wherein said third electrode is electrically connected to the surface of said first region between the surfaces of said layer and said second region.

5. A semiconductor device in accordance with claim 3, wherein said insulation film and said control electrode formed thereon have a recessed portion, said third electrode being electrically connected to the surface of said first region in said recessed portion.

* * * * *